(12) United States Patent
Moffat et al.

(10) Patent No.: US 6,906,584 B1
(45) Date of Patent: Jun. 14, 2005

(54) SWITCHABLE GAIN AMPLIFIER HAVING A HIGH-PASS FILTER POLE

(75) Inventors: Mark Moffat, Santa Cruz, CA (US); Marcus Granger-Jones, Scotts Valley, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 12 days.

(21) Appl. No.: 10/732,106

(22) Filed: Dec. 10, 2003

(51) Int. Cl.[7] .............................. H03F 3/45; H03G 3/20
(52) U.S. Cl. .................... 330/69; 330/144; 330/254
(58) Field of Search ........................... 330/69, 124 R, 330/144, 254, 284, 306; 455/253.2

(56) References Cited

U.S. PATENT DOCUMENTS

| | | | | |
|---|---|---|---|---|
| 4,047,122 A | * | 9/1977 | Rao ............................ 330/84 |
| 4,631,490 A | * | 12/1986 | Takahashi .................... 330/51 |
| 5,509,078 A | * | 4/1996 | Hiraoka et al. ............... 381/1 |
| 5,608,353 A | | 3/1997 | Pratt ........................... 330/295 |
| 5,629,648 A | | 5/1997 | Pratt ........................... 330/289 |
| 6,130,579 A | | 10/2000 | Iyer et al. .................... 330/285 |
| 6,191,656 B1 | | 2/2001 | Nadler ......................... 330/288 |
| 6,229,395 B1 | | 5/2001 | Kay ............................. 330/252 |
| 6,265,943 B1 | | 7/2001 | Dening et al. ............... 330/296 |
| 6,271,727 B1 | | 8/2001 | Schmukler ................... 330/284 |
| 6,285,239 B1 | | 9/2001 | Iyer et al. .................... 327/531 |
| 6,307,364 B1 | | 10/2001 | Augustine ..................... 324/95 |
| 6,313,705 B1 | | 11/2001 | Dening et al. ............... 330/276 |
| 6,329,809 B1 | | 12/2001 | Dening et al. ................. 324/95 |
| 6,333,677 B1 | | 12/2001 | Dening ........................ 330/296 |
| 6,356,150 B1 | | 3/2002 | Spears et al. ................ 330/145 |
| 6,369,656 B2 | | 4/2002 | Dening et al. ............... 330/296 |
| 6,369,657 B2 | | 4/2002 | Dening et al. ............... 330/296 |
| 6,392,487 B1 | | 5/2002 | Alexanian .................... 330/254 |
| 6,404,287 B2 | | 6/2002 | Dening et al. ............... 330/296 |
| 6,525,611 B1 | | 2/2003 | Dening et al. ............... 330/298 |
| 6,528,983 B1 | | 3/2003 | Augustine ..................... 324/95 |
| 6,560,452 B1 | | 5/2003 | Shealy ........................ 455/333 |
| 6,566,963 B1 | | 5/2003 | Yan et al. .................... 330/311 |
| 6,624,702 B1 | | 9/2003 | Dening ........................ 330/297 |
| 6,701,134 B1 | | 3/2004 | Epperson ..................... 455/102 |
| 6,701,138 B2 | | 3/2004 | Epperson et al. ......... 455/127.3 |
| 6,720,831 B2 | | 4/2004 | Dening et al. ............... 330/298 |
| 6,724,252 B2 | | 4/2004 | Ngo et al. .................... 330/133 |
| 6,731,145 B1 | | 5/2004 | Humphreys et al. ........ 327/156 |
| 2004/0072597 A1 | | 4/2004 | Epperson et al. ........... 455/572 |

* cited by examiner

*Primary Examiner*—Steven J. Mottola
(74) *Attorney, Agent, or Firm*—Withrow & Terranova, PLLC

(57) ABSTRACT

The present invention provides a switchable gain amplifier comprising a high-pass filter pole. The switchable gain amplifier comprises first and second input nodes for receiving first and second components of a differential input signal. A first input terminal of a first differential amplifier is coupled to the first input node, and a first input terminal of a second differential amplifier is coupled to the second input node. A first variable resistance is coupled between the first input terminal of the first differential amplifier and a second input terminal of the first differential amplifier. A second variable resistance is coupled between the first input terminal of the second differential amplifier and a second input terminal of the second differential amplifier. A differential capacitor is coupled between the second input terminal of the first differential amplifier and the second input terminal of the second differential amplifier.

45 Claims, 9 Drawing Sheets

SWITCHABLE GAIN AMPLIFIER HAVING A HIGH-PASS FILTER POLE

FIELD OF THE INVENTION

The present invention relates lo a switchable gain amplifier and more particularly relates to a switchable gain amplifier having a filter with a high-pass pole prior to an amplification stage.

BACKGROUND OF THE INVENTION

In non-packet based radio receivers, such as WCDMA receivers, gain control must be performed while receiving signals. Accordingly, it is desirable to minimize disruption to the received signal due to gain control. If DC offsets are present and the gain control is performed digitally, that is if gain is achieved using switches, the rapid change in gain causes a step response in the received signal. The step response de-sensitizes the receiver and may cause the receiver to lose the received signal until the receiver has settled.

The step response caused by DC offsets and digital gain control can be eliminated by rejecting the DC offset prior to amplification. One method of rejecting the DC offset is to couple the received signal to the input of an amplifier using a capacitor. However, in order to achieve a sufficiently low cut-off frequency for a high-pass filter, the time-constants required are large. Thus, the capacitor must also be large. The large capacitor causes the receiver to have a longer turn-on time because sufficient charge must be delivered to the capacitor to reach the required quiescent bias voltage. If it is desirable to implement the capacitor on a semiconductor die, the large capacitance also requires a large die area, thereby increasing cost. Thus, there remains a need for an amplifier that provides digital gain control, eliminates step responses in the output signal due to DC offsets in the input signal, and that has a short turn-on time.

SUMMARY OF THE INVENTION

The present invention provides a switchable gain amplifier comprising a filter with a high-pass pole. In general, the switchable gain amplifier rejects DC offsets in a differential input signal and provides gain control. The filter comprises variable resistances and a differential capacitor. The gain of the switchable gain amplifier is controlled based on controlling the values of the variable resistances, and since the differential capacitor stores charge that is essentially equivalent to a difference in DC voltage between the terminals of the capacitor, the switchable gain amplifier requires a substantially reduced start-up time.

In one embodiment, the switchable gain amplifier includes a first input node for receiving a first component of a differential input signal and a second input node for receiving a second component of the differential input signal. A first input terminal of a first differential amplifier is coupled to the first input node, and a first input terminal of a second differential amplifier is coupled to the second input node. A first variable resistance is coupled between the first input terminal of the first differential amplifier and a second input terminal of the first differential amplifier. A second variable resistance is coupled between the first input terminal of the second differential amplifier and a second input terminal of the second differential amplifier. A differential capacitor is coupled between the second input terminal of the first differential amplifier and the second input terminal of the second differential amplifier. In one embodiment, the first input terminal of the first differential amplifier is coupled to the first input node via a third variable resistance, and the first input of the second differential amplifier is coupled to the second input node via a fourth variable resistance.

The first differential amplifier amplifies a first differential voltage across the first variable resistance to provide a first amplified differential signal having first and second components. The second differential amplifier amplifies a second differential voltage across the second variable resistance to provide a second amplified differential signal having first and second components. A first summing circuitry combines the first component of the first amplified differential signal and the second component of the second amplified differential signal to provide a first component of a differential output signal. A second summing circuitry combines the second component of the first amplified differential signal and the first component of the second amplified differential signal to provide a second component of a differential output signal.

The gain of the switchable gain amplifier is controlled based on controlling the value of the variable resistances. In one embodiment, the sum of the first and third variable resistances is constant and equal to the sum of the resistances of the second and fourth variable resistances. Thus, the gain of the switchable gain amplifier is controlled by controlling the resistance of the first and second variable resistances. Further, the first, second, third, and fourth variable resistances and the differential capacitor form a high-pass filter that blocks DC offsets in the input signal. Since the differential capacitor stores charge that is essentially equivalent to a difference in DC voltage between the terminals of the capacitor, the switchable gain amplifier is suitable for use in systems requiring a very short start-up time.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1A:
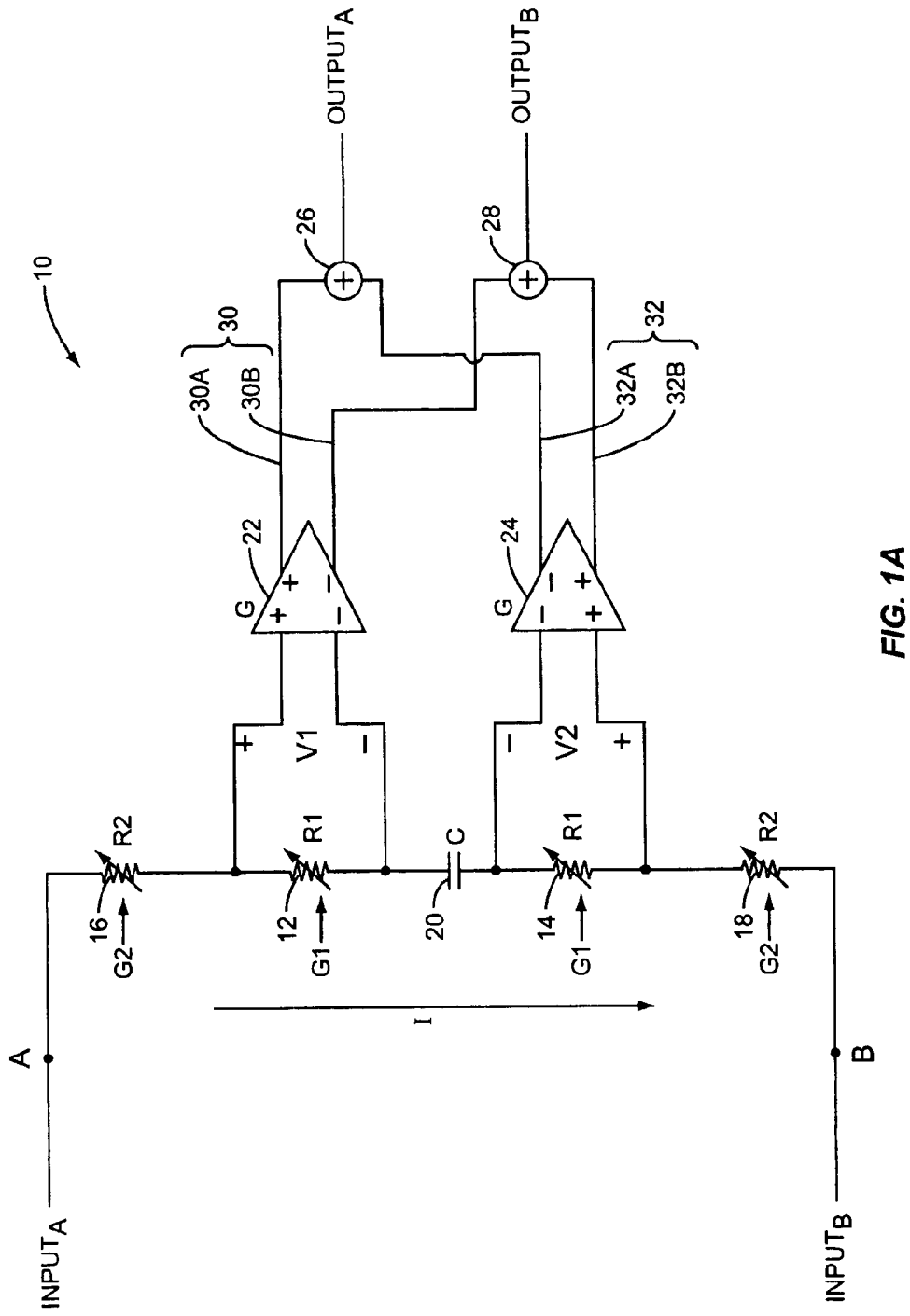
FIG. 1A illustrates a switchable gain amplifier having a high-pass frequency pole prior to an amplification stage according to one embodiment of the present invention.

FIG. 1A illustrates one embodiment of a switchable gain amplifier 10 having filter with a high-pass pole according to the present invention. In general, the switchable gain amplifier 10 includes variable resistors 12–18, differential capacitor 20, first differential amplifier 22, second differential amplifier 24, first summing circuitry 26, and second summing circuitry 28 arranged as illustrated. The first and second variable resistors 12 and 14, respectively, have a variable resistance value R1 and are control by a first control signal G1. The third and fourth variable resistors 16 and 18, respectively, have a variable resistance value R2 and are control by a second control signal G2. The first and second control signals G1 and G2 are provided by a control system (such as the one illustrated in FIG. 5). The differential capacitor 20 has a capacitance C. The variable resistors 12–18 and the differential capacitor 20 form a high-pass filter, wherein the 3 dB cut-off frequency of the high-pass filter is:

$$f_{3dB} = \frac{1}{2 \times \pi \times (R1 + R2) \times 2 \times C}.$$

Further, for frequencies greater than the cut-off frequency, the total gain of the switchable gain amplifier 10 is:

$$\text{Gain} = G \times \left(\frac{R1}{R1 + R2}\right),$$

where G is the gain of the differential amplifiers 22 and 24. In one embodiment, the sum of the resistances R1 and R2 is constant, thereby defining a constant cut-off frequency. When the sum of the resistances R1 and R2 is constant, the total gain (Gain) of the switchable gain amplifier 10 is directly proportional to the resistance value R1 of the first and second resistors 12 and 14, respectively.

At frequencies greater than the cut-off frequency ($f_{3dB}$), the switchable gain amplifier 10 has variable differential gain and common mode rejection. At frequencies less than the cut-off frequency ($f_{3dB}$), the switchable gain amplifier 10 has both differential and common mode rejection. Further, the differential capacitor 20 is differential. Therefore, the capacitor 20 stores charge that is essentially equivalent to a difference in DC voltage between the terminals of the capacitor 20, thereby requiring minimal charging when the switchable gain amplifier 10 is turned on and minimal discharging when the switchable gain amplifier 10 is turned off. Accordingly, the start-up time of the switchable gain amplifier 10 is greatly reduced as compared to other prior art systems. Another benefit of the differential capacitor 20 is that the differential capacitor 20 requires approximately ¼ of the die area required by non-differential circuit implementations.

In operation, the switchable gain amplifier 10 receives a differential input signal including a first input signal ($INPUT_A$) and a second input signal ($INPUT_B$). The first input signal ($INPUT_A$) is coupled to the switchable gain amplifier 10 at first input node (A), and the second input signal ($INPUT_B$) is coupled to the switchable gain amplifier 10 at second input node (B). The first input signal ($INPUT_A$) and the second input signal ($INPUT_B$) generate a current (I) through the variable resistors 12–18 and the differential capacitor 20. As stated above, the variable resistors 12–18 and the differential capacitor 20 form a filter with a high-pass pole and operate to block any DC component of the differential input signal. Thus, the current (I) does not contain any DC component of the differential input signal. Accordingly, any DC component of the differential input signal is rejected before the differential input signal is amplified by the differential amplifiers 22 and 24. Typically, the differential amplifiers 22 and 24 sink a small current at their inputs. Thus, an additional voltage drop is created across the first variable resistor 12 due to the small current into the first differential amplifier 22. However, due to the common mode rejection properties of the switchable gain amplifier 10, the additional voltage drop across the first variable resistor 12 is counterbalanced by an additional voltage drop across the second variable resistor 14. When the outputs of the differential amplifiers 22 and 24 are combined by the summing circuitries 26 and 28, the gains associated with the additional voltage drops across the variable resistors 12 and 14 cancel.

A first voltage V1 across the first variable resistor 12 and a second voltage V2 across the second variable resistor 14 are supplied to the first differential amplifier 22 and the second differential amplifier 24, respectively. The first differential amplifier 22 amplifies the first voltage V1 and provides a first amplified differential signal 30 having components 30A and 30B. The second differential amplifier 24 amplifies the second voltage V2 and provides a second amplified differential signal 32 having components 32A and 32B. The first summing circuitry 26 combines the first component 30A of the first amplified differential signal 30 and the second component 32B of the second amplified differential signal 32 and provides a first component ($OUTPUT_A$) of a differential output signal. The second summing circuitry 28 combines the second component 30B of the first amplified differential signal 30 and the second component 32A of the second amplified differential signal 32 and provides a second component ($OUTPUT_B$) of the differential output signal.

Figure 1B:
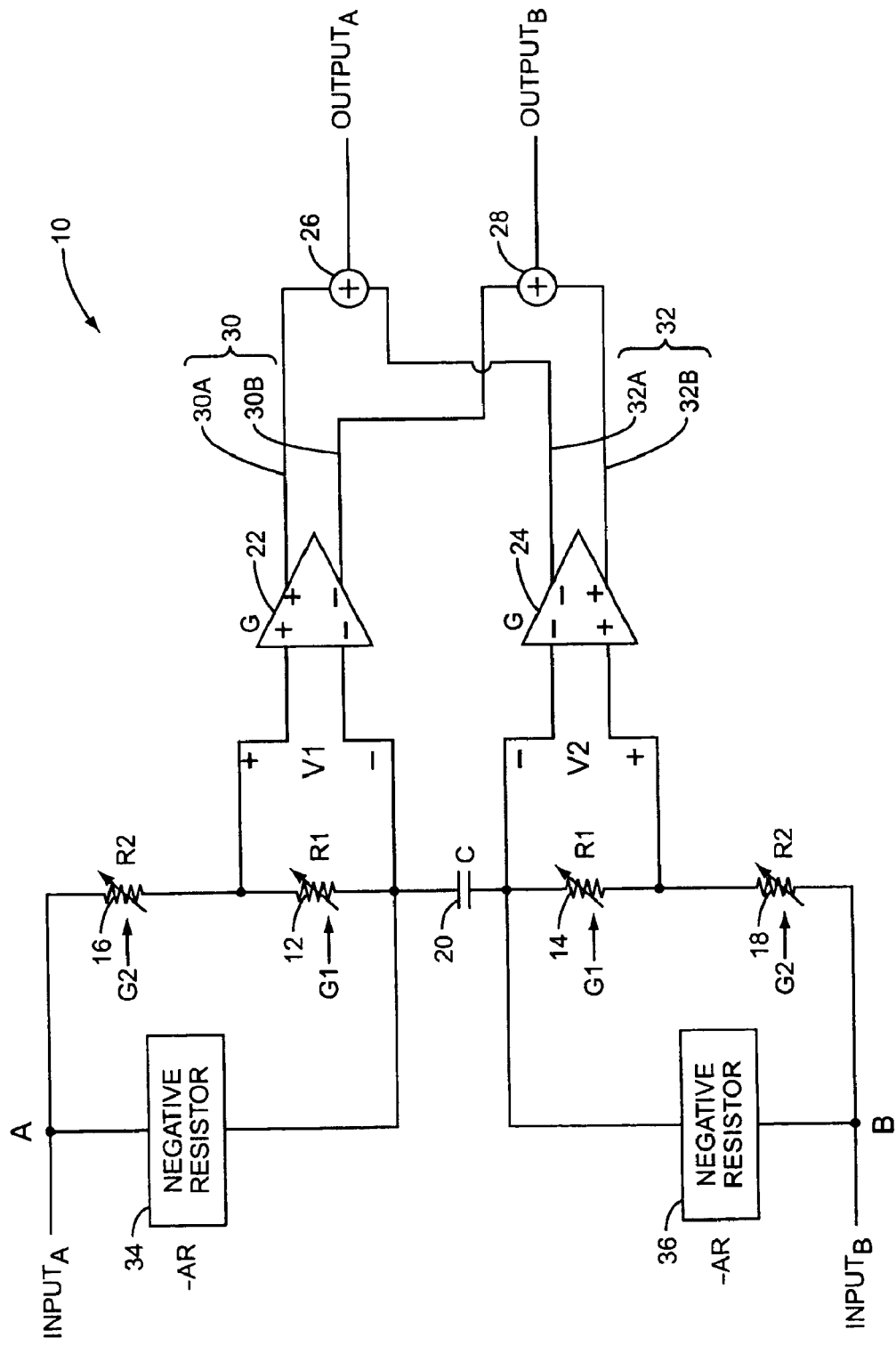
FIG. 1B illustrates the switchable gain amplifier of FIG. 1A further including negative resistors for lowering a cut-off frequency of the high-pass frequency pole.

FIG. 1B illustrates a second embodiment of the present invention. This embodiment is essentially the same as the embodiment of FIG. 1 with the addition of first and second negative resistors 34 and 36. The negative resistors 34 and 36 have resistances essentially equal to $-A \times R$, where A can be any integer or decimal number greater than 1. In one embodiment, the sum of the resistances R1 and R2 are constant and the resistance R is the sum of the resistances R1 and R2. The variable resistors 12–18 and the differential capacitor 20 form a high-pass filter, wherein the 3 dB cut-off frequency of the high-pass filter is:

$$f_{3dB} = \frac{(A-1)}{A \times 2 \times \pi \times (R1+R2) \times 2 \times C}.$$

Therefore, the cut-off frequency is proportional to the ratio (A−1)/A. Further, for frequencies greater than the cut-off frequency, the total gain of the switchable gain amplifier 10 is:

$$\text{Gain} = G \times \left(\frac{R1}{R1+R2}\right).$$

Thus, the cut-off frequency depends on the negative resistance (−A×R) of the negative resistors 34 and 36, and the gain (Gain) of the switchable gain amplifier 10 is independent of the negative resistance (−A×R) of the negative resistors 34 and 36.

By placing the first negative resistor 34 in parallel with the variable resistors 12 and 16, the combined resistance of the first negative resistor 34 and the variable resistors 12 and 16 is larger than the sum of resistances of the variable resistors 12 and 14 (R1+R2) by a factor of A/(A−1), when R=R1+R2. Similarly, the second negative resistor 36 in parallel with the variable resistors 14 and 18 provides a combined resistance that is larger than the sum of resistances of the variable resistors 14 and 18 (R1+R2) by a factor of A/(A−1), when R=R1+R1. Thus, the negative resistors 34 and 36 decrease the cut-off frequency without increasing the resistance values of the variable resistors 12–18 or increasing the capacitance of the differential capacitor 20. This is beneficial because increasing the size of the variable resistors 12–18 would increase noise and increasing the capacitance of the differential capacitor 20 would require an increased amount of die area, which is expensive. The negative resistors 34 and 36 can be any circuit that decreases current as the differential voltage increases such as a translinear transconductor. One embodiment of the negative resistors 34 and 36 is described in more detail below.

Figure 2A:
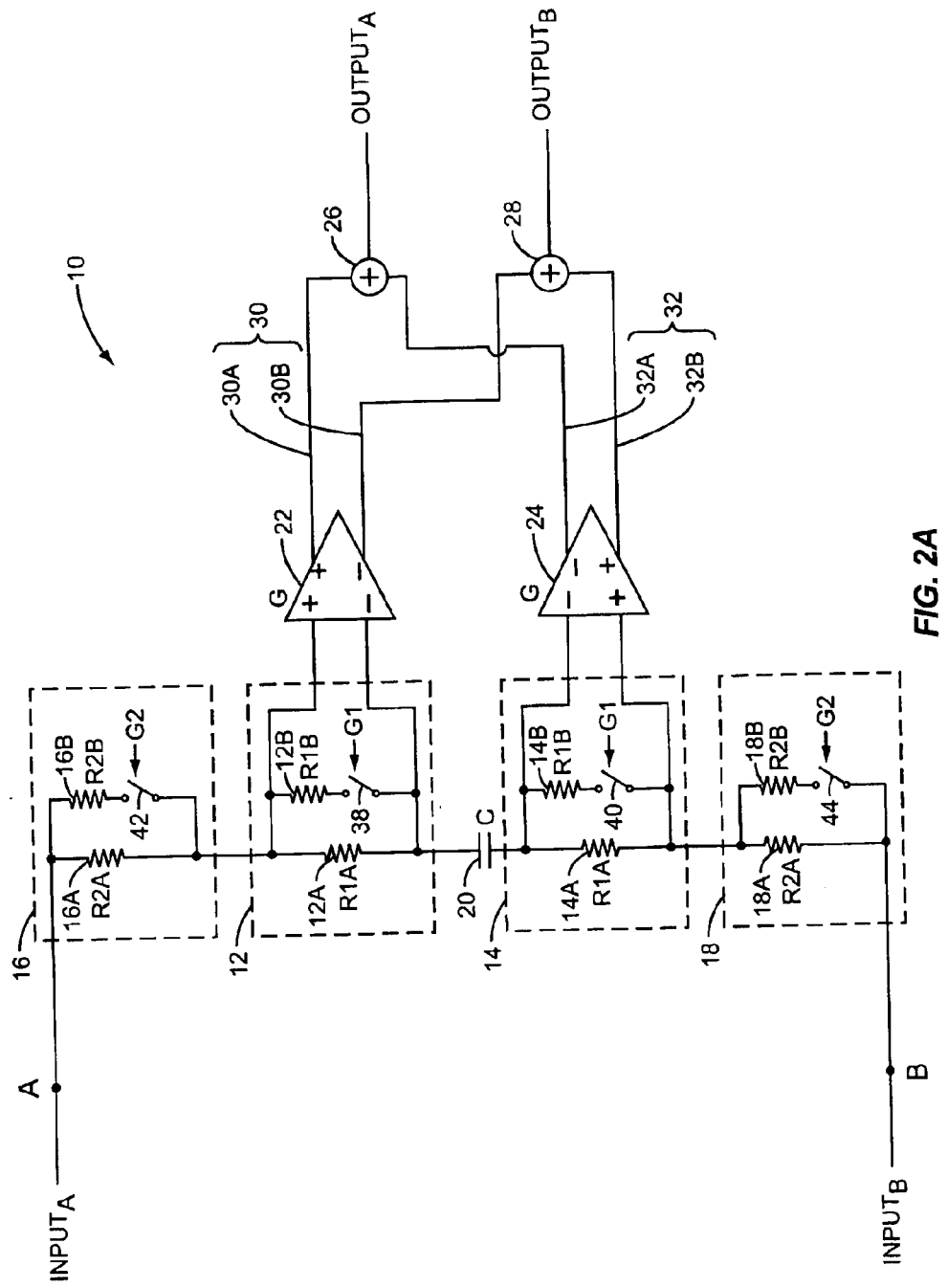
FIG. 2A illustrates a switchable gain amplifier having a high-pass frequency pole prior to an amplification stage according to a second embodiment of the present invention.

FIG. 2A illustrates another embodiment of the present invention. In general, the embodiment of FIG. 2A operates essentially the same as the embodiment of FIG. 1A described above. However, in this embodiment, the first variable resistor 12 includes resistors 12A and 12B and a first switch 38. The second variable resistor 14 includes resistors 14A and 14B and a second switch 40. The third variable resistor 16 includes resistors 16A and 16B and a third switch 42, and the fourth variable resistor 18 includes resistors 18A and 18B and a fourth switch 44. The first and second switches 38 and 40 are controlled by a first gain control signal G1, and the third and fourth switches 42 and 44 are controlled by a second gain control signal G2. The gain control signals G1 and G2 are provided by a control system (such as the one illustrated in FIG. 5). In one embodiment, the combined resistance of the first and third variable resistors 12 and 16 and the combined resistance of the second and fourth variable resistors 14 and 18 are constant. Thus, either G1 is asserted or G2 is asserted, but G1 and G2 are not asserted or unasserted at the same time.

Figure 2B:
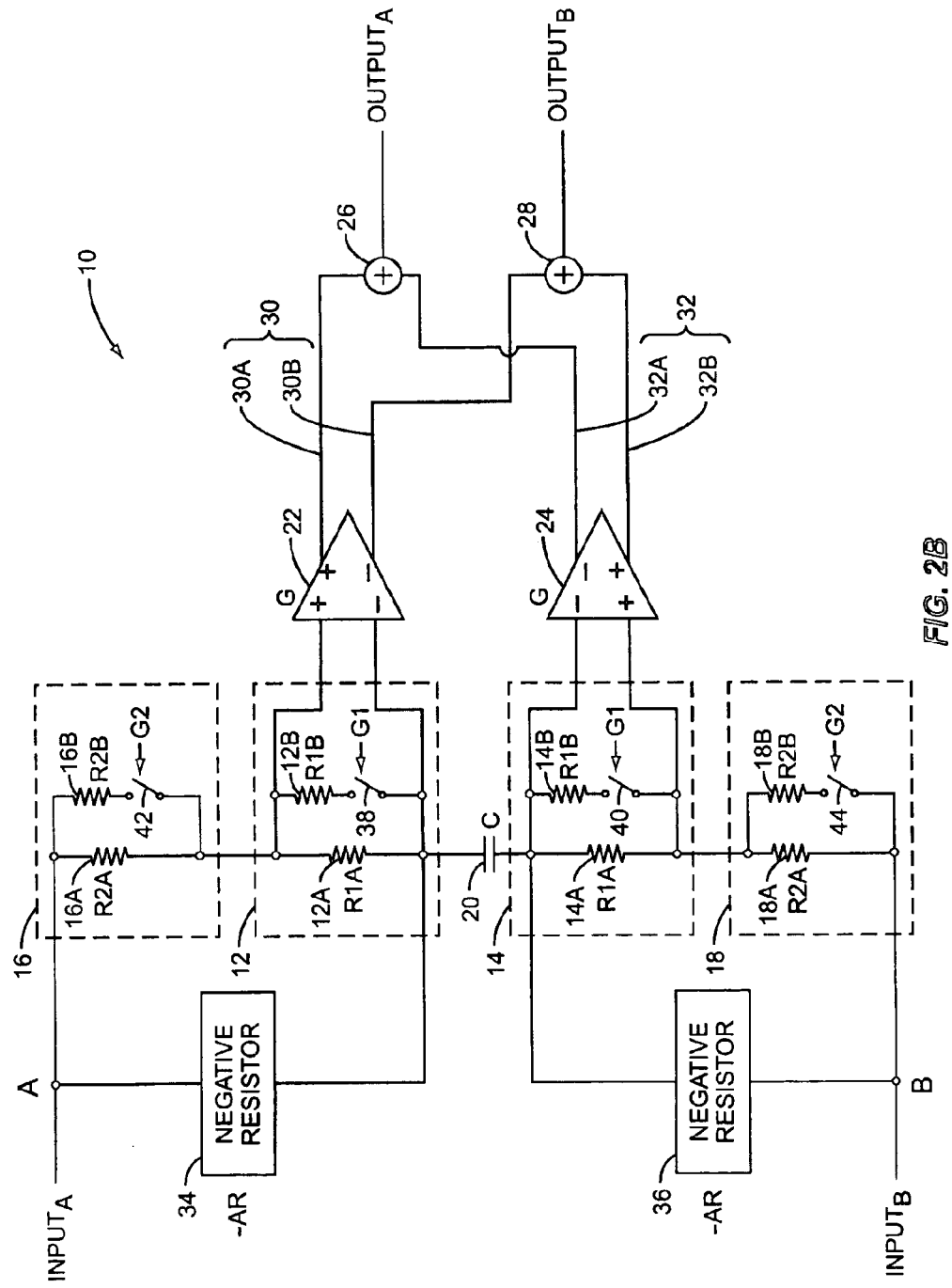
FIG. 2B illustrates the switchable gain amplifier of FIG. 2A further including negative resistors for lowering a cut-off frequency of the high-pass frequency pole.

FIG. 2B illustrates another embodiment of the present invention similar to the embodiment of FIG. 2A with the addition of the negative resistors 34 and 36. As in FIG. 1B, the negative resistors 34 and 36 provide greater resistance without increasing the real resistance of the variable resistors 12–18. Thus, the negative resistors 34 and 36 decrease the cut-off frequency of the high-pass filter created by the variable resistors 12–18 and the differential capacitor 20 without Increasing the resistances of the variable resistors 12–18, which would increase noise, or increasing the size and capacitance of the differential capacitor 20, which is expensive when the switchable gain amplifier is implemented on a single semiconductor die.

FIGS. 2A and 2B illustrate the first variable resistor 12 as including only the resistors 12A and 12B and the first switch 38 for simplicity. However, it should be noted that the first variable resistor may include any number of resistors 12B and corresponding switches 38 in parallel with the resistor 12A and may receive any number of control signals. Similarly, the variable resistors 14–18 may include any number of resistors and corresponding switches and may receive any number of control signals.

Figure 3A:
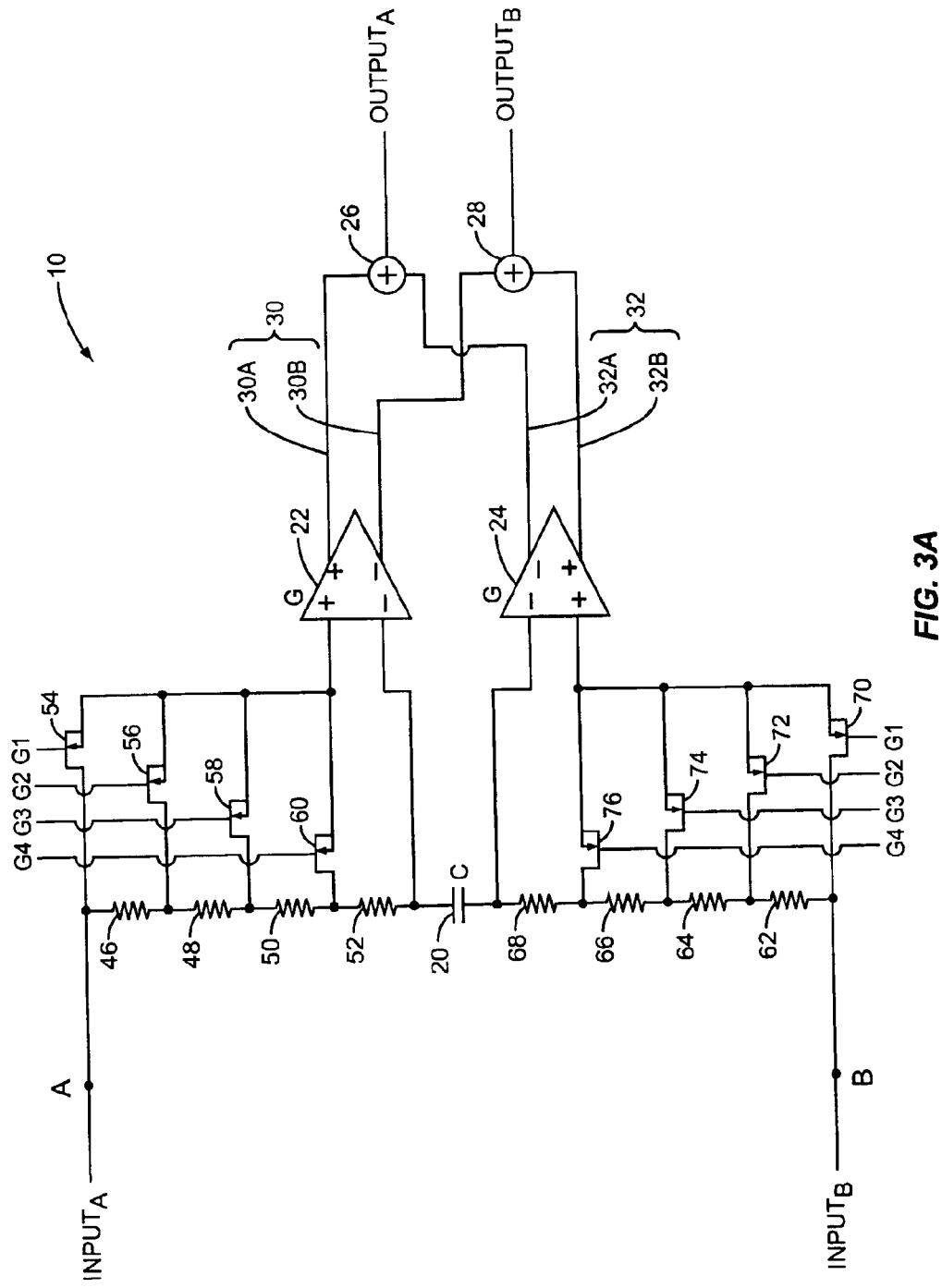
FIG. 3A illustrates a switchable gain amplifier having a high-pass frequency pole prior to an amplification stage according to a third embodiment of the present invention.

FIG. 3A illustrates yet another embodiment of the present invention. This embodiment is similar to the embodiment of FIG. 1. However, the first and third variable resistors 12 and 16 (FIG. 1) are implemented using a circuit including resistors 46–52 and transistor switches 54–60 arranged as illustrated. Similarly, the second and fourth variable resistors 14 and 18 (FIG. 1) are implemented using a circuit including resistors 62–68 and transistor switches 70–76 arranged as illustrated. In this embodiment, the cut-off frequency is defined as:

$$f_{3dB} = \frac{1}{2 \times \pi \times R \times 2 \times C},$$

where R is the sum of the resistances of the resistors 46–52, which is equivalent to the sum of the resistances of the resistors 62–68. Since, the sum of the resistances of the resistors 46–52 is constant, the cut-off frequency is also constant. It should be noted that the resistors 46 and 62 have essentially the same resistance value, the resistors 48 and 64 have essentially the same resistance value, the resistors 50 and 66 have essentially the same resistance value, and the resistors 52 and 58 have essentially the same resistance value. Further, as stated above, for frequencies greater than the cut-off frequency, the total gain of the switchable gain amplifier 10 is:

$$\text{Gain} = G \times \left(\frac{R_x}{R}\right),$$

where $R_x$ is the variable resistance between the input nodes of the differential amplifiers 22 and 24. Since $R_x$ is variable, the gain of the switchable gain amplifier 10 is also variable.

The variable resistance $R_x$ is controlled by gain control signals G1–G4. When the first gain control signal G1 is asserted, the variable resistance $R_x$ is equal to the sum of the resistances of the resistors 46–52, which is equivalent to the sum of the resistances of the resistors 62–68. When the second gain control signal G2 is asserted, the variable resistance $R_x$ is equal to the sum of the resistances of the resistors 48–52, which is equivalent to the sum of the resistors 64–68. When the third gain control signal G3 is asserted, the variable resistance $R_x$ is equal to the sum of the resistances of the resistors 50–52, which is equivalent to the sum of the resistors 66–68. When the fourth gain control signal G4 is asserted, the variable resistance $R_x$ is equal to the resistance of the resistor 52, which is equivalent to the resistance of the resistor 68. It should be noted that although the illustrated embodiment includes four resistors 46–52 and the corresponding switches 54–60, any number of resistors, switches, and gain control signals may be used to provide more precise gain control.

Figure 3B:
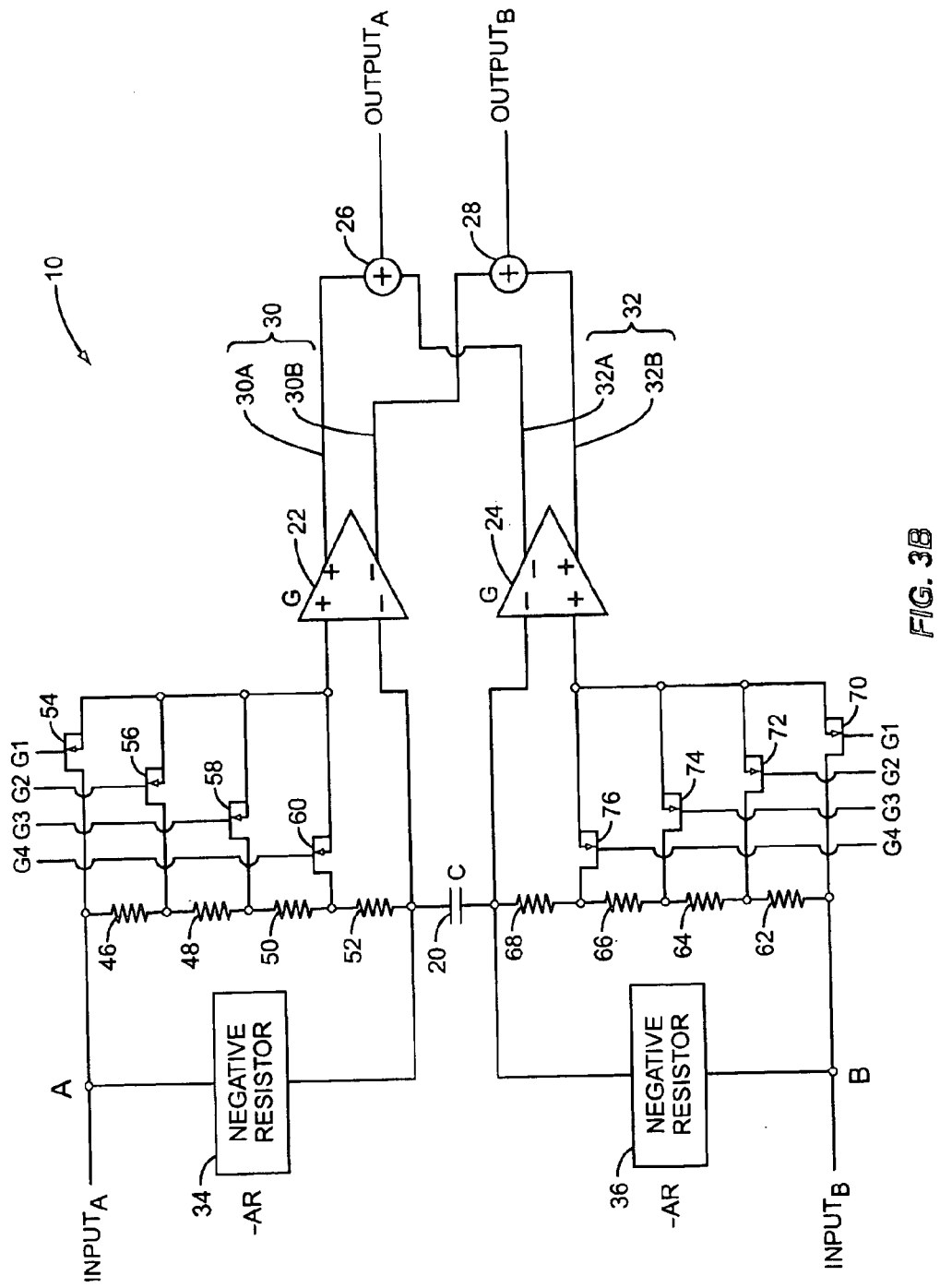
FIG. 3B illustrates the switchable gain amplifier of FIG. 3A further including negative resistors for lowering a cut-off frequency of the high-pass frequency pole.

FIG. 3B illustrates another embodiment of the present invention similar to the embodiment of FIG. 3A with the addition of the negative resistors 34 and 36. As in FIG. 1B, the negative resistors 34 and 36 provide greater resistance, and therefore a lower cut-off frequency, without increasing the real resistance of the resistors 46–52 and 62–68 or increasing the size and capacitance of the differential capacitor 20.

FIGS. 3A and 3B illustrate the resistors 46–52 and 62–68, transistor 54–60 and 70–76, and gain control signals G1–G4 for simplicity. However, it should be noted that there may be any number of resistors, transistors, and gain control signals in order to provide more precise gain control.

Figure 4:
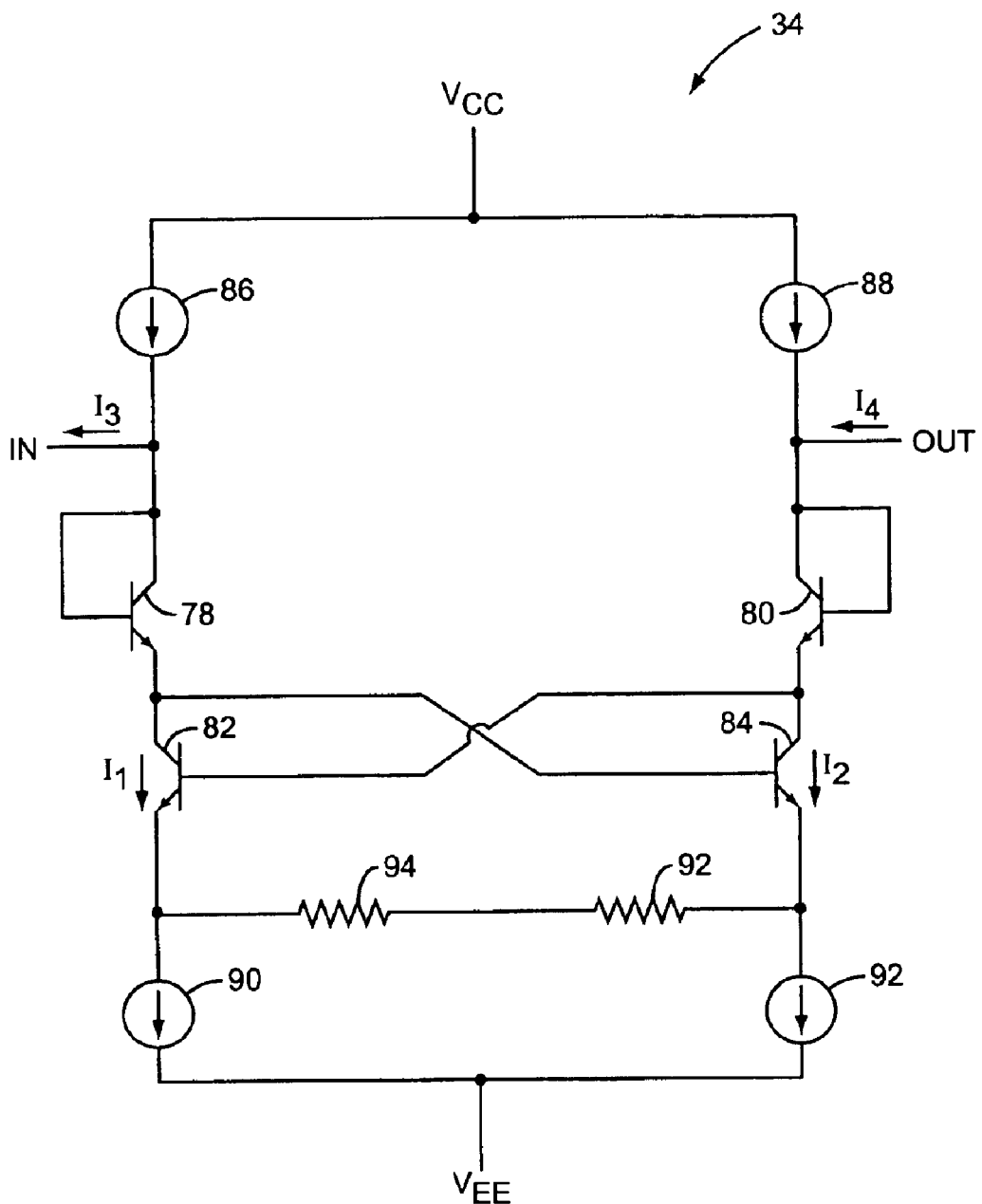
FIG. 4 illustrates the negative resistors of FIGS. 1B, 2B, and 3B according to one embodiment of the present invention.

FIG. 4 illustrates one embodiment of the negative resistor 34 of FIGS. 1B, 2B, and 3B. This description equally applies to the negative resistor 36. In general, the negative resistor 34 Includes transistors 78–84, current sources 86–92, and resistors 94 and 96 arranged as illustrated. In operation, as the voltage at input terminal (IN) increases relative to the voltage at output terminal (OUT), the transistors 82 and 84 are biased such that a first current ($I_1$) flowing through the transistor 82 decreases and a second current ($I_2$) flowing through the transistor 84 increases. Since the current provided by the current source 86 is essentially constant, a third current ($I_3$) that exits the negative resistor 34 via the input terminal (IN) increases as the first current ($I_1$) decreases. In a similar fashion, a fourth current ($I_4$) that enters the negative resistor 34 via the output terminal (OUT) increases as the second current ($I_2$) Increases. Ideally, the third current ($I_3$) and the fourth current ($I_4$) are have essentially the same magnitude. A positive voltage increase at the input terminal (IN) relative to the voltage at the output terminal (OUT) increases the fourth current ($I_4$) flowing out of the input terminal (IN). Thus, the negateive resistor 34 has a negative resistance.

Figure 5:
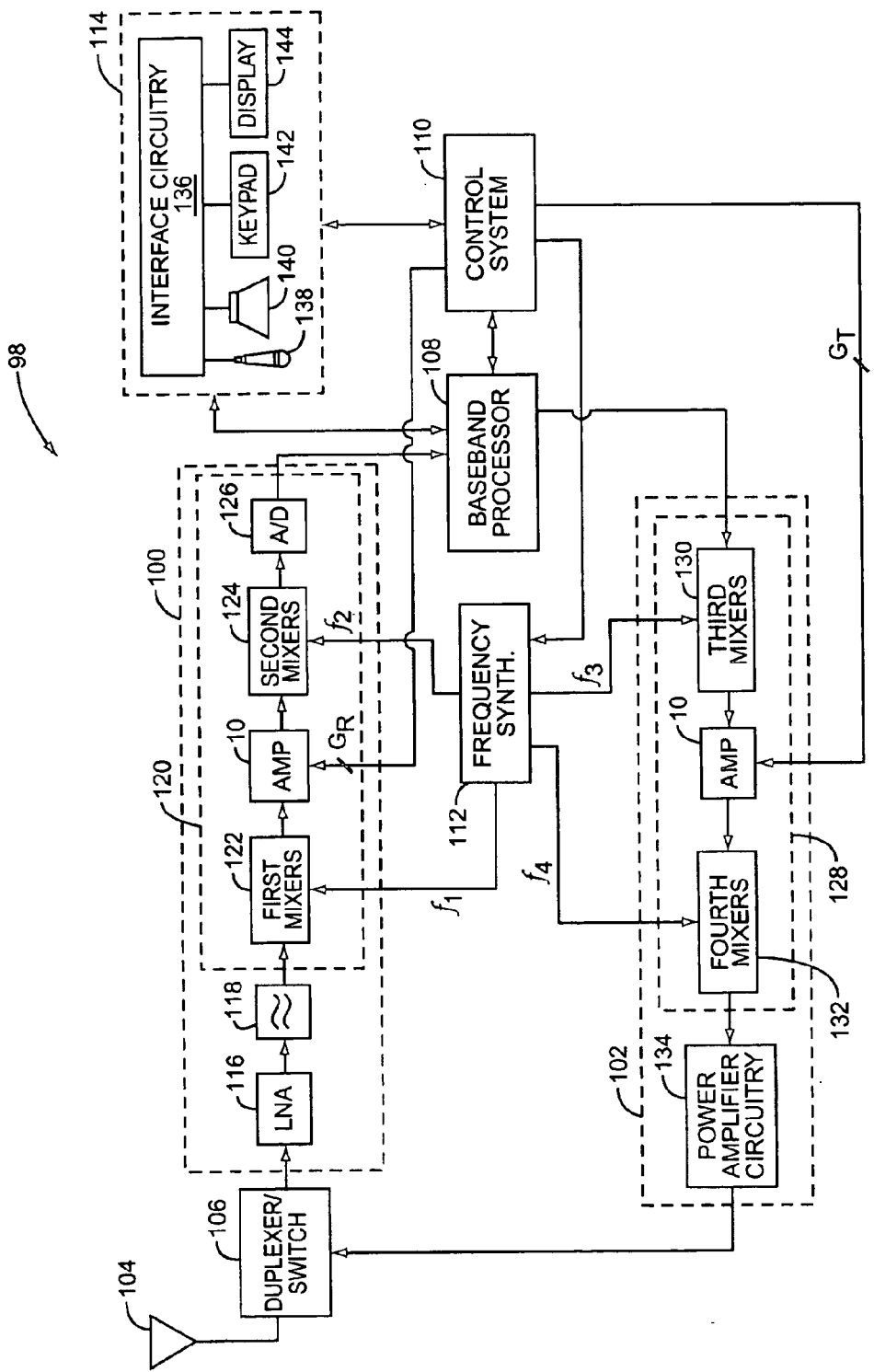
FIG. 5 illustrates a mobile terminal implementing a switchable gain amplifier having a highpass frequency pole according to one embodiment of the present invention.

In an exemplary embodiment, the switchable gain amplifier 10 of the present invention may be incorporated in a mobile terminal 98, such as a mobile telephone, wireless personal digital assistant, or like communication device. The basic architecture of a mobile terminal 98 implementing a dual conversion scheme is represented in FIG. 5 and may include a receiver front end 100, a radio frequency transmitter section 102, an antenna 104, a duplexer or switch 106, a baseband processor 108, a control system 110, a frequency synthesizer 112, and an interface 114. The receiver front end 100 receives information bearing radio frequency signals from one or more remote transmitters provided by a base station. A low noise amplifier 116 amplifies the signal. A filter circuit 118 minimizes broadband interference in the received signal, while downconversion and digitization circuitry 120 downconverts the filtered, received signal to an very low intermediate or baseband frequency signal, which is then digitized into one or more digital streams. In this embodiment, the downcoversion and digitization circuitry 120 implements a dual conversion scheme and includes first mixers 122 that convert the filtered, received signal to an intermediate frequency signal. The switchable gain amplifier 10 of the present invention amplifies the intermediate frequency signal and rejects DC. The control system 110 provides a receive gain control signal GR to the switchable gain amplifier 10 to provide gain control. The receive gain control signal GR can be the gain control signals G1–G4 as illustrated in FIGS. 1A and 1B, 2A and 2B, and 3A and 3B. The second mixers 124 converts the amplified intermediate frequency signal to either a baseband signal or a very low intermediate frequency (VLIF) signal, which is digitized by the analog-to-digital converter 126.

The baseband processor 108 processes the digitized received signal to extract the information or data bits conveyed in the received signal. This processing typically comprises demodulation, decoding, and error correction operations. As such, the baseband processor 108 is generally implemented in one or more digital signal processors (DSPs).

On the transmit side, the baseband processor 108 receives digitized data, which may represent voice, data, or control information, from the control system 110, which it encodes for transmission. The encoded data is output to the transmitter 102, where it is used by a modulator 128. In this embodiment, the modulator 128 implements the dual conversion scheme and includes third mixers 130 that modulate an intermediate frequency carrier signal having a frequency $f_3$ by the encoded data, wherein the frequency $f_3$ is greater than the cut-off frequency of the filter of the switchable gain amplifier 10. The modulated intermediate frequency signal is amplified by the switchable gain amplifier 10 of the present invention. The control system 110 provides a transmit gain control signal $G_T$ to the switchable gain amplifier 10 to provide gain control for the transmitter 102. The transmit gain control signal $G_T$ can be the gain control signals G1–G4 as illustrated in FIGS. 1A and 1B, 2A and 2B, and 3A and 3B. The amplified signal is upconverted to a radio frequency (RF) signal by the fourth mixers 132, and the RF signal is amplified by the power amplifier 134. The power amplifier circuitry 134 amplifies the RF signal to a level appropriate for transmission and delivers the amplified RF signal to the antenna 104 through the duplexer or switch 106.

A user may interact with the mobile terminal 98 via the interface 114, which may include interface circuitry 136 associated with a microphone 138, a speaker 140, a keypad 142, and a display 144. The interface circuitry 136 typically includes analog-to-digital converters, digital-to-analog converters, amplifiers, and the like. Additionally, it may include a voice encoder/decoder, in which case it may communicate directly with the baseband processor 108.

The microphone 138 will typically convert audio input, such as the user's voice, into an electrical signal, which is then digitized and passed directly or indirectly to the baseband processor 108. Audio information encoded in the received signal is recovered by the baseband processor 108, and converted by the interface circuitry 136 into an analog signal suitable for driving speaker 140. The keypad 142 and display 144 enable the user to interact with the mobile terminal 98, input numbers to be dialed, address book information, or the like, as well as monitor call progress information.

Figure 6:
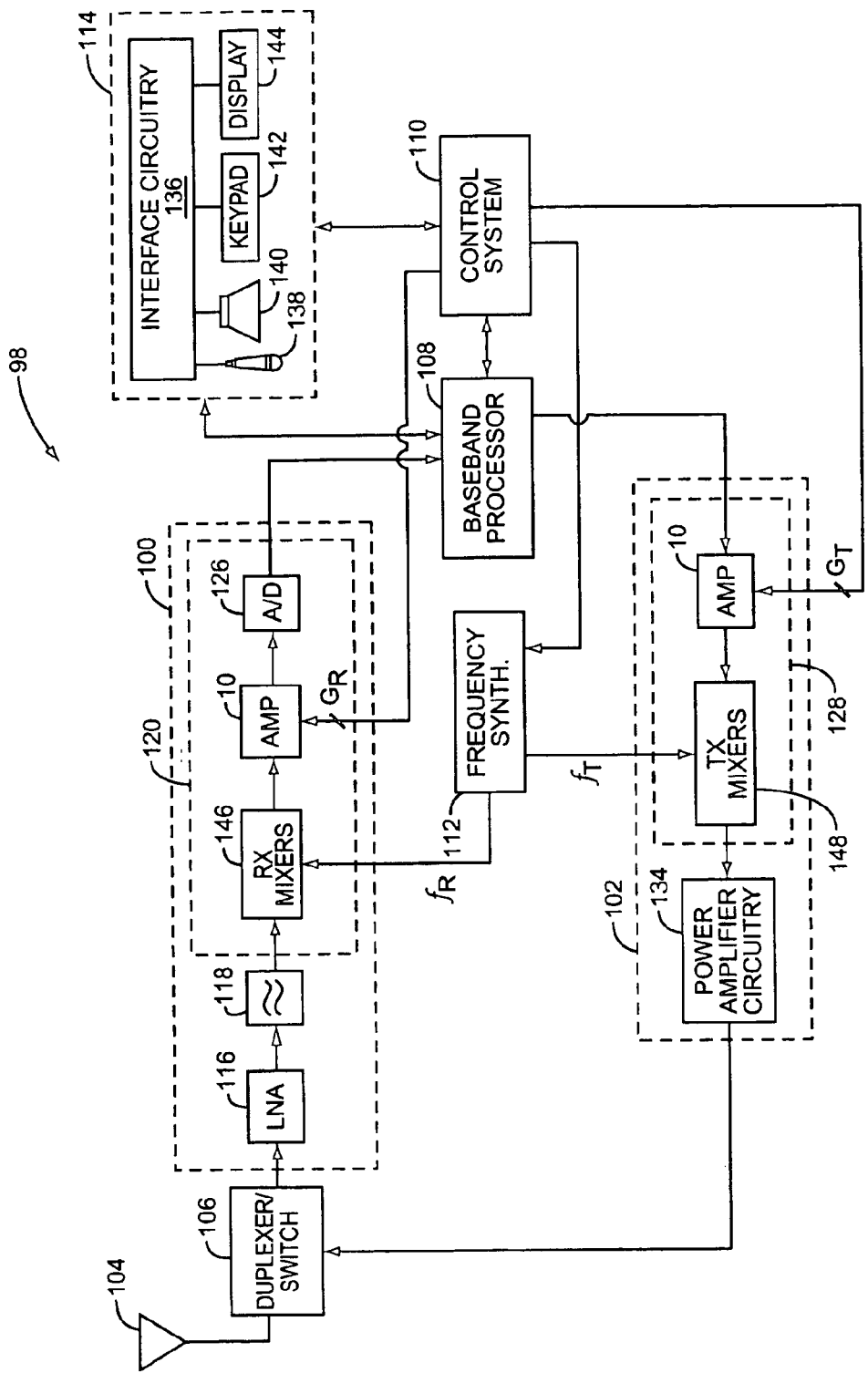
FIG. 6 illustrates a mobile terminal implementing a switchable gain amplifier having a high-pass frequency pole according to another embodiment of the present invention.

FIG. 6 illustrates another embodiment of the mobile terminal 98. In this embodiment, the mobile terminal 98 implements either a direct conversion scheme where the received signal is directly converted to a baseband or a very low intermediate frequency scheme where the received signal is directly converted to a very low intermediate frequency (VLIF) signal. Whether the mobile terminal 98 implements the direct conversion scheme or the VLIF scheme depends on the particular implementation. Just as in FIG. 5, the mobile terminal 98 of FIG. 6 may include the receiver front end 100, the radio frequency transmitter section 102, the antenna 104, the duplexer or switch 106, the baseband processor 108, the control system 110, the frequency synthesizer 112, and the interface 114. In this embodiment, the downcoversion and digitization circuitry 120 implements a direct conversion or very low intermediate frequency scheme and includes receive mixers 146 that convert the filtered, received signal to either a baseband signal or a very low intermediate frequency (VLIF) signal depending on the particular implementation. The switchable gain amplifier 10 of the present invention amplifies the baseband or VLIF signal and rejects DC. When the amplifier 10 amplifies a baseband signal, the cutoff frequency of the amplifier is substantially close to DC. Since the baseband signal has a bandwidth centered at DC, the amplifier 10 rejects DC offsets and components of the baseband signal at DC. However, the cutoff frequency of the amplifier 10 is substantially close to DC such that relevant components of the baseband signal are amplified. The control system 110 provides the receive gain control signal $G_R$ to the switchable gain amplifier 10 to provide gain control. The receive gain control signal $G_R$ can be the gain control signals G1–G4 as illustrated in FIGS. 1A and 1B, 2A and 2B, and 3A and 3B. After passing through the amplifier 10, the baseband or VLIF signal is digitized by the analog-to-digital converter 126.

On the transmit side, the modulator 128 of this embodiment may also implement either the direct conversion scheme or the VLIF scheme and includes the amplifier 10 and transmit mixers 148. The baseband or VLIF signal is amplified by the switchable gain amplifier 10 of the present invention. The control system 110 provides the transmit gain control signal $G_T$ to the switchable gain amplifier 10 to provide gain control for the transmitter 102. The transmit gain control signal $G_T$ can be the gain control signals G1–G4 as illustrated in FIGS. 1A and 1B, 2A and 2B, and 3A and 3B. The amplified signal is upconverted to a radio frequency (RF) signal by the transmit mixers 148, and the RF signal is amplified by the power amplifier 134.

The switchable gain amplifier 10 of the present invention provides substantial opportunity for variation without departing from the spirit or scope of the present invention. For example, the differential amplifiers 22 and 24 may be any differential voltage-to-current amplifier, any differential voltage-to-voltage amplifier, operational amplifiers, or a differential pair. As another example, the variable resistors 12-18 and the variable resistance circuits of FIGS. 3A and 3B should be considered exemplary rather than limiting.

Those skilled in the art will recognize improvements and modifications to the preferred embodiments of the present invention. All such improvements and modifications are considered within the scope of the concepts disclosed herein and the claims that follow.

What is claimed is:

1. A switchable gain amplifier comprising:
   a first input node adapted to receive a first component of a differential signal;
   a second input node adapted to receive a second component of the differential signal;
   a first differential amplifier having a first input terminal and a second input terminal, the first input terminal coupled to the first input node;
   a second differential amplifier having a first input terminal and a second input terminal, the first input terminal coupled to the second input node;
   a first variable resistance having a first terminal coupled to the first input terminal of the first differential amplifier and a second terminal coupled to the second input terminal of the first differential amplifier;
   a second variable resistance having a first terminal coupled to the first input terminal of the second differential amplifier and a second terminal coupled to the second input terminal of the second differential amplifier; and
   a differential capacitor coupled between the second terminal of the first variable resistance and the second terminal of the second variable resistance.

2. The amplifier of claim 1 wherein the first and second variable resistances determine a gain of the switchable gain amplifier.

3. The amplifier of claim 1 further comprising:
   a third variable resistance coupled between the first input terminal of the first differential amplifier and the first input node; and
   a fourth variable resistance coupled between the first input terminal of the second differential amplifier and the second input node.

4. The amplifier of claim 3 wherein the first, second, third, and fourth variable resistances and the differential capacitor define a high-pass filter having a cut-off frequency that is inversely proportional to a sum of the first and third variable resistances, the sum of the first and third variable resistances being essentially equivalent to a sum of the second and fourth variable resistances.

5. The amplifier of claim 4 wherein the sum of the first and third variable resistances is essentially constant and the sum of the second and fourth variable resistances is essentially constant, thereby defining a constant cut-off frequency.

6. The amplifier of claim 3 further comprising:
   a first negative resistance coupled between the first input node and the second terminal of the first variable resistance; and
   a second negative resistance coupled between the second input node and the second terminal of the second variable resistance.

7. The amplifier of claim 6 wherein the first and second negative resistances are translinear transconductors.

8. The amplifier of claim 6 wherein the first, second, third, and fourth variable resistances, the first and second negative resistances, and the differential capacitor define a high-pass filter having a cut-off frequency inversely proportional to a combined resistance of the first, second, third, and fourth variable resistances and the first and second negative resistances.

9. The amplifier of claim 8 wherein the first and second negative resistances each have a negative resistance defined as —AR, where A is a number greater than 1 and R is a sum of the first and third variable resistances, the sum of the first and third variable resistances being essentially equivalent to a sum of the second and fourth variable resistances.

10. The amplifier of claim 9 wherein the sum of the first and third variable resistances is essentially constant and the sum of the second and fourth variable resistances is essentially constant, thereby defining a constant cut-off frequency.

11. The amplifier of claim 3 wherein the first and second variable resistances are controlled by a first control signal and the third and fourth variable resistances are controlled by second control signal.

12. The amplifier of claim 11 further comprising a control system adapted to provide the first and second control signals.

13. The amplifier of claim 12 wherein the control system further controls a gain of the switchable gain amplifier via the first control signal.

14. The amplifier of claim 13 wherein the control system further controls a cut-off frequency of the switchable gain amplifier via the second control signal.

15. The amplifier of claim 14 wherein the control system further provides the second control signal such that the cut-off frequency is essentially constant.

16. The amplifier of claim 11 wherein the first and second control signals are digital control signals.

17. The amplifier of claim 3 wherein each of the first, second, third, and fourth variable resistances comprise:
- a first resistance having a first terminal and a second terminal;
- a second resistance having an first terminal and a second terminal, the first terminal of the second resistance coupled to the first terminal of the first resistance; and
- a switch coupled between the second terminal of the second resistance and the second terminal of the first resistance, the switch controlled by a control signal.

18. The amplifier of claim 3 wherein the first and third variable resistances are implemented as a first circuit, the first circuit comprising:
- a first plurality of resistances connected in series between the first input node and the second input terminal of the first differential amplifier, each of the first plurality of resistances having an input terminal and an output terminal; and
- a first plurality of transistor switches each coupled between the input terminal of a corresponding one of the input terminals of the first plurality of resistances and the first input terminal of the first differential amplifier, the first plurality of transistors controlled by a plurality of control signals;
- wherein the first and third variable resistances are varied by selectively activating one of the first plurality of transistor switches via the plurality of control signals.

19. The amplifier of claim 18 wherein the second and fourth variable resistances are implemented as a second circuit, the second circuit comprising:
- a second plurality of resistances connected in series between the second input node and the second input terminal of the second differential amplifier, each of the second plurality of resistances having an input terminal and an output terminal; and
- a second plurality of transistor switches each coupled between the input terminal of a corresponding one of the input terminals of the second plurality of resistances and the first input terminal of the second differential amplifier, the second plurality of transistor switches controlled by the plurality of control signals;
- wherein the second and fourth variable resistances are varied by selectively activating one of the second plurality of transistor switches via the plurality of control signals.

20. The amplifier of claim 1 wherein the first differential amplifier amplifies a first differential voltage across the first variable resistor to provide a first amplified differential signal having a first and second component, and the second differential amplifier amplifies a second differential voltage across the second variable resistor to provide a second amplified differential signal having a first and second component.

21. The amplifier of claim 20 further comprising:
- first summing circuitry adapted to combine the first component of the first differential signal and the second component of the second differential signal to provide a first component of a differential output signal; and
- second summing circuitry adapted to combine the second component of the first differential signal and the first component of the second differential signal to provide a second component of the differential output signal.

22. A radio receiver comprising:
- mixing circuitry adapted to downconvert a received radio frequency signal and provide a differential downconverted signal; and
- a switchable gain amplifier coupled to an output of the first mixing circuitry and adapted to amplify the downconverted signal, the switchable gain amplifier comprising:
  - a first input node adapted to receive a first component of the downconverted signal;
  - a second input node adapted to receive a second component of the downconverted IF signal;
  - a first differential amplifier having a first input terminal and a second input terminal, the first input terminal coupled to the first input node;
  - a second differential amplifier having a first input terminal and a second input terminal, the first input terminal coupled to the second input node;
  - a first variable resistance having a first terminal coupled to the first input terminal of the first differential amplifier and a second terminal coupled to the second input terminal of the first differential amplifier;
  - a second variable resistance having a first terminal coupled to the first input terminal of the second differential amplifier and a second terminal coupled to the second input terminal of the second differential amplifier; and
  - a differential capacitor coupled between the second terminal of the first variable resistance and the second terminal of the second variable resistance.

23. The receiver of claim 22 wherein the switchable gain amplifier further comprises:
- a third variable resistance coupled between the first input terminal of the first differential amplifier and the first input node; and
- a fourth variable resistance coupled between the first input terminal of the second differential amplifier and the second input node.

24. The receiver of claim 23 wherein the switchable gain amplifier further comprises:
- a first negative resistance coupled between the first input node and the second terminal of the first variable resistance; and
- a second negative resistance coupled between the second input node and the second terminal of the second variable resistance.

25. The receiver of claim 23 wherein the first and second variable resistances are controlled by a first control signal and the third and fourth variable resistances are controlled by second control signal.

26. The receiver of claim 25 wherein the first and second control signals are digital control signals.

27. The receiver of claim 25 further comprising a control system adapted to provide the first and second control signals.

28. The receiver of claim 27 wherein the control system further controls a gain of the switchable gain amplifier via the first control signal.

29. The receiver of claim 28 wherein the control system further controls a cut-off frequency of the switchable gain amplifier via the second control signal.

30. The receiver of claim 29 wherein the control system further provides the second control signal such that the cut-off frequency is essentially constant.

31. The receiver of claim 22 wherein the mixing circuitry is further adapted to provide the downconverted signal as a baseband signal.

32. The receiver of claim 22 wherein the mixing circuitry is further adapted to provide the downconverted signal as a very low intermediate frequency signal.

33. The receiver of claim 22 wherein the mixing circuitry is further adapted to provide the downconverted signal as an intermediate freuquency signal.

34. A radio transmitter comprising:
circuitry adapted to provide a differential transmit signal;
a switchable gain amplifier coupled to an output of the circuitry and adapted to amplify the differential transmit signal and provide an amplified transmit signal, the switchable gain amplifier comprising:
   a first input node adapted to receive a first component of the differential transmit signal;
   a second input node adapted to receive a second component of the differential transmit signal;
   a first differential amplifier having a first input terminal and a second input terminal, the first input terminal coupled to the first input node;
   a second differential amplifier having a first input terminal and a second input terminal, the first input terminal coupled to the second input node;
   a first variable resistance having a first terminal coupled to the first input terminal of the first differential amplifier and a second terminal coupled to the second input terminal of the first differential amplifier;
   a second variable resistance having a first terminal coupled to the first input terminal of the second differential amplifier and a second terminal coupled to the second input terminal of the second differential amplifier; and
   a differential capacitor coupled between the second terminal of the first variable resistance and the second terminal of the second variable resistance; and
mixing circuitry adapted to convert the amplified transmit signal to a radio frequency signal.

35. The transmitter of claim 34 wherein the switchable gain amplifier further comprises:
   a third variable resistance coupled between the first input terminal of the first differential amplifier and the first input node; and
   a fourth variable resistance coupled between the first input terminal of the second differential amplifier and the second input node.

36. The transmitter of claim 35 wherein the switchable gain amplifier further comprises:
   a first negative resistance coupled between the first input node and the second terminal of the first variable resistance; and
   a second negative resistance coupled between the second input node and the second terminal of the second variable resistance.

37. The transmitter of claim 35 wherein the first and second variable resistances are controlled by a first control signal and the third and fourth variable resistances are controlled by second control signal.

38. The transmitter of claim 37 wherein the first and second control signals are digital control signals.

39. The transmitter of claim 37 further comprising a control system adapted to provide the first and second control signals.

40. The transmitter of claim 39 wherein the control system further controls again of the switchable gain amplifier via the first control signal.

41. The transmitter of claim 40 wherein the control system further controls a cut-off frequency of the switchable gain amplifier via the second control signal.

42. The transmitter of claim 41 wherein the control system further provides the second control signal such that the cut-off frequency is essentially constant.

43. The transmitter of claim 34 wherein the circuitry is further adapted to provide the transmit signal as a baseband signal.

44. The transmitter of claim 34 wherein the circuitry is further adapted to provide the transmit signal as a very low intermediate frequency signal.

45. The transmitter of claim 34 wherein the circuitry is further adapted to upconvert a baseband signal to an intermediate frequency signal and provide the intermediate frequency signal to the switchable gain amplifier as the transmit signal.

* * * * *